United States Patent [19]

Thompson et al.

[11] Patent Number: 4,488,112

[45] Date of Patent: Dec. 11, 1984

[54] HALL EFFECT DEVICE TEST CIRCUIT

[75] Inventors: Robert Thompson, Sharon, N. Dak.; Hendrik W. van Husen, Glen Ellyn, Ill.

[73] Assignee: GTE Automatic Electric Inc., Northlake, Ill.

[21] Appl. No.: 412,758

[22] Filed: Aug. 30, 1982

[51] Int. Cl.³ ............................................. G01R 35/00
[52] U.S. Cl. .................................. 324/202; 324/235; 324/251; 338/32 H
[58] Field of Search ....................... 324/202, 251, 235; 338/32 H

[56] References Cited

U.S. PATENT DOCUMENTS

| 4,084,135 | 4/1978 | Enabnit | 324/239 |
| 4,099,238 | 7/1978 | Suzuki | 324/251 |
| 4,156,191 | 5/1979 | Knight et al. | 324/205 |
| 4,190,799 | 2/1980 | Miller et al. | 324/239 |
| 4,230,987 | 10/1980 | Mordwinkin | 324/236 |
| 4,270,087 | 5/1981 | Littwin | 324/205 |

Primary Examiner—Stewart J. Levy
Attorney, Agent, or Firm—Gregory G. Hendricks; Peter Xiarhos

[57] ABSTRACT

A Hall effect device test circuit which detects Hall effect device operate and release point failures. A magnetic field circuit, a voltage switching circuit, a comparison circuit, a retriggerable monostable multivibrator circuit and a visual indicator circuit are included. The comparison circuit compares the Hall effect device switching voltage to a predetermined threshold and controls the multivibrator circuit which causes a visual pass/fail signal to be provided.

16 Claims, 1 Drawing Figure

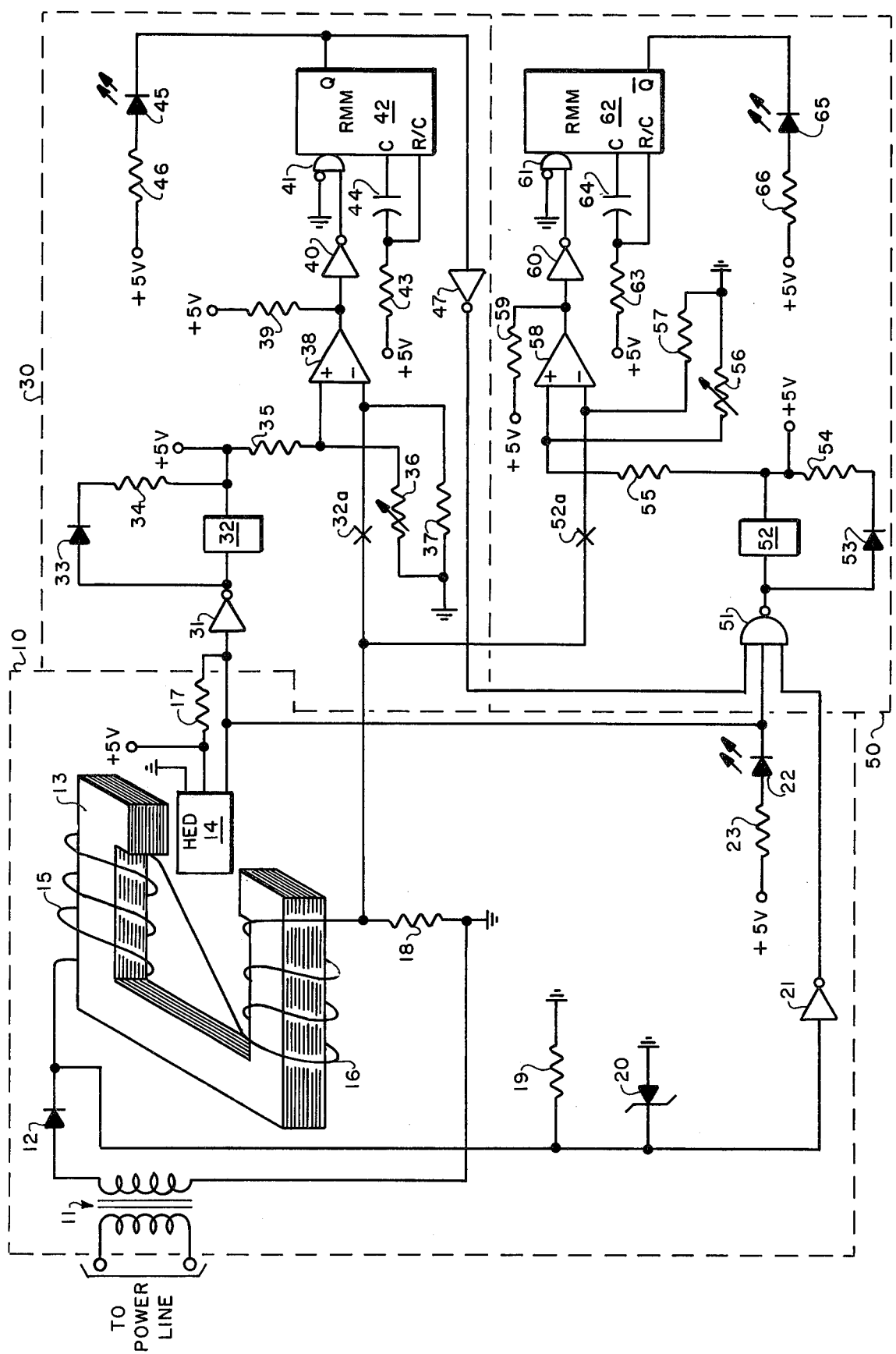

HALL EFFECT DEVICE TEST CIRCUIT

FIELD OF THE INVENTION

The present invention relates to test circuitry and more particularly to a Hall effect device test circuit.

BACKGROUND OF THE INVENTION

Hall effect device related circuitry has been used for a variety of purposes. U.S. Pat. No. 4,156,191, issued to Knight, et al. on May 22, 1979, discloses an apparatus for adjusting the magnetic coupling between a Hall effect device and an operating magnet. U.S. Pat. No. 4,190,799, issued to Miller, et al. on Feb. 26, 1980, discloses a method for measuring the magnitude and sign of the Hall angle of the material of a wafer. U.S. Pat. No. 4,270,087, issued to A. K. Littwin on May 26, 1981, discloses an apparatus for testing permanent magnets using electromagnets and Hall sensors. U.S. Pat. No. 4,084,135, issued to R. S. Enabnit on Apr. 11, 1978, discloses a system and method for checking the sensitivity and performance of an electromagnetic field variation detector. Finally, U.S. Pat. No. 4,230,987, issued to G. Mordwinkin on Oct. 28, 1980, discloses a digital eddy current apparatus for generating metallurgical signatures and monitoring metallurgical contents of an electrically conductive material.

While the circuits disclosed in these patents are related to magnetic field or Hall effect devices, none of these patents discloses a method for monitoring the tolerance of the operate and release levels of a Hall effect device.

Accordingly, it is the object of the present invention to provide a novel test circuit which monitors the operate and release levels of a Hall effect device.

SUMMARY OF THE INVENTION

The present invention is a circuit which detects out-of-tolerance operate and release levels of a Hall effect device under test. This circuit includes a power signal source which provides an alternating current signal. A magnetic field circuit includes a diode which converts this alternating current signal to a half-wave signal, and applies it to an electromagnet which produces a periodic magnetic field of varying intensity. A sample voltage resistor provides a voltage having a magnitude corresponding to the intensity of the magnetic flux. The Hall effect device operates and releases in response to each cycle of magnetic flux.

A first detection circuit provides a first visual signal if the Hall effect device operates at a magnetic flux level below a maximum operating threshold and a second detection circuit provides a second visual signal if the Hall effect device releases at a magnetic flux level above a minimum release threshold.

DESCRIPTION OF THE DRAWING

The single FIGURE of the accompanying drawing is a schematic diagram of a Hall effect device test circuit in accordance with the present invention.

DESCRIPTION OF THE PREFERRED EMBODIMENT

Referring now to the accompanying drawing, the Hall effect device test circuit of the present invention is shown. Magnetic field circuit 10 is connected between a power line and operate and release point circuits 30 and 50, respectively. Magnetic field circuit 10 includes coils 15 and 16 wound on electromagnet 13. These coils are connected to the power line via diode 12, transformer 11 and sample voltage resistor 18. Hall effect device (HED) 14 is connected in magnetic field proximity to electromagnet 13 and it is electrically connected to operate and release point circuits, 30 and 50, respectively.

Operate point circuit 30 includes relay 32 which is connected to Hall effect device 14 via inverter 31. This relay is further connected to variable resistor 36 and the positive input of amplifier 38. The negative input of this amplifier is connected to the junction of resistor 37 and relay break contact 32a which is further connected to sample voltage resistor 18. The output of comparator 38 is connected to inverter 40 which is further connected to retriggerable monostable multivibrator (RMM) 42 via gate 41. Resistor 43 and capacitor 44 are connected to the C and R/C inputs of this multivibrator, and operate to define its time constant.

Release point circuit 50 is connected to HED 14 via gate 51 rather than an inverter. Otherwise release point circuit 50 is identical to operate point circuit 30.

Gate 51 is further connected to light emitting diode (LED) 22 and inverter 21 which is connected to the junction of zener diode 20, resistor 19 and diode 12.

Sixty cycle current is applied to transformer 11 via a power line. This current is converted to a 60 cycle half wave signal via diode 12. This half wave signal flows through coils 15 and 16, thereby causing a corresponding fluctuating magnetic field in the air gap of electromagnet 13. This half wave signal also flows through sample voltage resistor 18 thereby providing an electrical signal corresponding to the fluctuating magnetic field. When HED 14 is inserted into the gap of electromagnet 13 it switches on and off at a 60 cycle rate, thereby causing LED 22 to also flash at a 60 cycle rate. This flashing LED indicates that a functioning Hall effect device has been inserted into the gap of electromagnet 13.

Operate point circuit 30 tests for the maximum operating or turn-on point of HED 14. When HED 14 is turned off, a logic level 1 signal appears at the input to inverter 31. Inverter 31 then causes a logic level 0 signal to appear at its output, thereby causing relay 32 to operate and close make contacts 32a. When these contacts close the sample voltage developed across sample voltage resistor 18 is applied to the negative input of amplifier 38, thereby detecting the instantaneous magnetic field intensity. When the magnetic field developed by electromagnet 13 is of sufficient strength to cause HED 14 to operate, it applies a logic level 0 signal to the input of inverter 31 which then applies a logic level 1 signal to relay 32, causing it to release and thereby open contacts 32a. Potentiometer 36 provides a predetermined operating threshold voltage at the positive input of comparator 38. Therefore, if Hall effect device 14 operates properly, i.e. before exceeding the threshold, contacts 32a will disconnect the sample voltage from the negative input of comparator 38, before it exceeds the threshold voltage appearing at the positive input of this comparator. Under these conditions comparator 38 produces a logic level 1 signal at its output and inverter 40 therefore applies a logic level 0 signal to gate 41. RMM 42 then applies a logic level 0 signal to its Q output causing LED 45 to turn on. This indicates that the Hall effect device is generating properly. Since the magnetic field applied to HED 14 varies at a 60 Hz rate, LED 45 also flashes at a 60 Hz rate when HED 14 operates properly, i.e. turns on before the maximum allowable operating or turn-on point.

If HED 14 does not operate properly, i.e. it either doesn't turn on or it turns on after the maximum allowable operating or turn-on point, then relay 32 does not disconnect sample voltage resistor 18 before its voltage exceeds the threshold voltage applied to the positive input of comparator 38. Under these conditions comparator 38 provides a logic level 0 signal at its output and inverter 40 applies a logic level 1 signal to gate 41. RMM 42 responds to this logic level 1 signal appearing at the input of gate 41 by applying a logic level 1 signal at its Q output. This causes LED 45 to turn off. Since the magnetic field fluctuates at a 60 Hz rate, the logic level 1 signal appearing at the input to gate 41 also fluctuates at a 60 Hz rate. However, the time constant defined by resistor 43 and capacitor 44 is of a longer duration than the 60 Hz input signal. Thus the logic level 1 signal appearing at the input to gate 41 reappears before RMM 42 times out. Since it is repeatedly retriggered before timing out it provides a continuous logic level 1 signal at its ouput. Under these conditions LED 45 remains turned off, thereby indicating that HED 14 does not turn on before the maximum allowable operating or turn-on point.

Release point circuit 50 tests for a minimum release or turn-off point. This circuitry does not operate if HED 14 is faulty, i.e. operates above the maximum allowable operate or turn-on point. Under such conditions the logic level 1 signal appearing at the Q output of RMM 42 causes a logic level 0 signal to appear at the output of inverter 47. This results in a logic level 1 signal appearing at the output of gate 51 which prevents relay 52 from operating. Zener diode 20 prevents signals greater than 5 volts from appearing at the input to inverter 21 and the voltage developed across resistor 19, which is proportional to the magnetic field, is applied to the input of inverter 21.

In order for release point circuit 50 to operate, logic level 1 signals must appear at all three inputs to gate 51. When operate point circuit 30 indicates that HED 14 is turning on properly, a logic level 0 signal appears at the Q output of RMM 42. Inverter 47 converts this to a logic level 1 signal appearing at the first input of gate 51. Inverter 21 applies a logic level 1 signal to the third input of gate 51 when it detects a logic level 0 signal at its input, thus indicating that the magnetic field is at a low level. Also, a logic level 1 signal appears at the second input to gate 51 when HED 14 turns off.

Under these conditions all three inputs to gate 51 are at a logic level 1, and therefore gate 51 applies a logic level 0 signal to relay 52 which then turns on and operates make contacts 52a thereby applying the sample voltage developed across sample voltage resistor 18 to the negative input of amplifier 58.

If HED 14 turns off before the minimum release or turn-off point as defined by potentiometer 56, then the value of the sample voltage developed across sample voltage resistor 18 is greater than such minimum threshold. Therefore amplifier 58 provides a logic level 0 signal which is inverted to a logic level 1 signal by inverter 60 and applied to the input of gate 61. RMM 62 responds to this logic level 1 signal by providing a logic level 0 signal on its $\bar{Q}$ output, thereby turning on LED 65 to indicate that HED 14 turned off properly, i.e. before the minimum release or turn-off point. Since the magnetic field operates at a 60 Hz rate, the input signal to gate 61 also appears at a 60 Hz rate. However, the time constant defined by resistor 63 and capacitor 64 is of a longer duration than the 60 Hz input signal. Thus the logic level 1 signal appearing at the input to gate 61 reappears before RMM 62 times out. Since it is repeatedly retriggered before timing out, it provides a continuous logic level 1 signal at its output. Under these conditions LED 65 remains turned off thereby indicating that HED 14 turns off before the minimum allowable release or turn-off point.

If HED 14 turns off after the minimum release or turn-off point, the sample voltage applied to the negative input of amplifier 58 is less than the threshold voltage at the positive input. Therefore, a logic level 1 signal appears at the input to inverter 60 and a logic level 0 signal appears at the input to gate 61. RMM 62 responds to this logic level 0 signal by applying a logic level 1 signal to its $\bar{Q}$ output thereby turning off LED 65 to indicate that HED 14 is not operating properly, i.e., it turns off below the minimum release or turn-off point.

The Hall effect device test circuit of the present invention thus compares the operate and release levels of a Hall effect device under test to predetermined thresholds of magnetic flux which corresponds to the maximum allowable operating flux and the minimum allowable release flux. Visual displays also indicate whether the Hall effect device switches properly.

It will be obvious to those skilled in the art that numerous modifications of the present invention can be made without departing from the spirit of the invention which shall be limited only by the scope of the claims appended hereto.

What is claimed is:

1. A Hall effect device test circuit for use in a test system including a power signal source, said test circuit comprising:

magnetic field means connected to said power signal source, operated in response to said power signal to periodically provide a magnetic field of varying intensity;

voltage reference means connected to said power source, operated in response to said power signal, to periodically provide a sample voltage of varying magnitude and proportional to the intensity of said magnetic field;

a Hall effect device connected in magnetic field proximity to said magnetic field means, operated in response to each occurrence of said magnetic field of a first predetermined intensity to provide an electrical signal of a first characteristic, and operated in response to each occurrence of said magnetic field of a second predetermined intensity to provide an electrical signal of a second characteristic;

first detection means connected to said voltage reference means and said Hall effect device, operated in response to each electrical signal of said first characteristic and an associated sample voltage of a magnitude less than a first predetermined value to provide a steady first visual indication; and second detection means connected to said voltage reference means and said Hall effect device, operated in response to each electrical signal of said second characteristic and an associated sample voltage of a magnitude greater than a second predetermined value to provide a steady second visual indication.

2. A Hall effect device test circuit as claimed in claim 1, wherein there is further included:
   third detection means connected to said Hall effect device, operated in response to each electrical signal of said first characteristic to provide a third visual indication.

3. A Hall effect device test circuit as claimed in claim 2, wherein said third detection means comprises a light emitting diode.

4. A Hall effect device test circuit as claimed in claim 1, wherein: said first detection means is further operated in response to each electrical signal of said first characteristic and an associated sample voltage of a magnitude greater than said first predetermined value to inhibit said first visual indication.

5. A Hall effect device test circuit as claimed in claim 4, wherein said first detection means comprises:
   comparison means connected to said Hall effect device and said voltage reference means operated in response to each electrical signal of said first characteristic and an associated sample voltage of said magnitude less than said first predetermined value to provide a comparison signal of a first characteristic, and further operated in response to each electrical signal of said first characteristic and said sample voltage of said magnitude greater than said first predetermined value to provide a comparison signal of a second characteristic;
   storage means connected to said comparison means, operated in response to periodic comparison signals of said first characteristic to provide a steady storage signal of a first characteristic, and further operated in response to said periodic comparison signals of said second characteristic to provide a steady storage signal of a second characteristic; and
   visual signaling means connected to said storage means, operated in response to said storage signal of said first characteristic to provide said first visual indication and further operated in response to said storage signal of said second characteristic to inhibit said first visual indication.

6. A Hall effect device test circuit as claimed in claim 5, wherein said comparison means comprises: a comparator having first and second inputs, said first input connected to a resistor network defining a threshold for said sample voltage of said first predetermined value; and
   a relay circuit connected to said Hall effect device, operated in response to said electrical signal of said first characteristic to disconnect said voltage reference means from said second input.

7. A Hall effect device test circuit as claimed in claim 1, wherein: said second detection means is further operated in response to each electrical signal of said second characteristic and an associated sample voltage of a magnitude less than said second predetermined value to inhibit said second visual indication.

8. A Hall effect device test circuit as claimed in claim 7, wherein said second detection means comprises:
   comparison means connected to said Hall effect device and said voltage reference means operated in response to each electrical signal of said second characteristic and an associated sample voltage of said magnitude greater than said second predetermined value to provide a comparison signal of a first characteristic, and further operated in response to each electrical signal of said second characteristic and said sample voltage of said magnitude less than said second predetermined value to provide a comparison signal of a second characteristic;
   storage means connected to said comparison means, operated in response to periodic comparison signals of said first characteristic to provide a steady storage signal of a first characteristic, and further operated in response to periodic comparison signals of said second characteristic to provide a steady storage signal of a second characteristic; and
   visual signaling means connected to said storage means, operated in response to said storage signal of said first characteristic to provide said second visual indication and further operated in response to said storage signal of said second characteristic to inhibit said second visual indication.

9. A Hall effect device test circuit as claimed in claim 8, wherein said comparison means comprises: a comparator having first and second inputs, said first input connected to a resistor network defining a threshold for said sample voltage of said second predetermined value; and
   a relay circuit connected to said Hall effect device, operated in response to said electrical signal of said second characteristic to connect said voltage reference means to said second input.

10. A Hall effect device test circuit as claimed in claims 5 or 8, wherein said storage means comprises: a retriggerable monostable multivibrator having a time constant longer than the period of said first or second comparison signals.

11. A Hall effect device test circuit as claimed in claims 5 or 8, wherein said visual signaling means comprises a light emitting diode.

12. A Hall effect device test circuit as claimed in claim 1, wherein said magnetic field means comprises: an electromagnet connected to a diode, whereby said magnetic field is unidirectional.

13. A Hall effect device test circuit as claimed in claim 1, wherein said voltage reference means comprises a resistor.

14. A Hall effect device test circuit as claimed in claim 1, wherein there is further included: disabling means connected between said first and second detection means, operated in response to an absence of said first visual indication to provide a disable signal;
   said second detection means being disabled in response to said disable signal, whereby said second visual indication is inhibited.

15. A Hall effect device test circuit as claimed in claim 14, wherein said disabling means comprises an inverter.

16. A Hall effect device test circuit as claimed in claim 1, wherein there is further included: disabling means connected between said magnetic field means and said second detection means, operated in response to a predetermined value of said power signal to provide a disable signal;
   said second detection being disabled in response to said disable signal, whereby said second visual indication is inhibited.

* * * * *